(12) United States Patent
Lagler et al.

(10) Patent No.: US 10,348,361 B2
(45) Date of Patent: Jul. 9, 2019

(54) MEASURING DEVICE AND METHOD FOR PHASE-COHERENT ANALYSIS OF FREQUENCY-HOPPING SIGNALS

(71) Applicant: Rohde & Schwarz GmbH & Co. KG, Munich (DE)

(72) Inventors: Andreas Lagler, Rosenheim (DE); Luke Cirillo, Poing (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/938,838

(22) Filed: Mar. 28, 2018

(65) Prior Publication Data

US 2019/0103893 A1 Apr. 4, 2019

Related U.S. Application Data

(60) Provisional application No. 62/565,777, filed on Sep. 29, 2017.

(51) Int. Cl.
| | | |
|---|---|---|
| *H04B 1/7136* | (2011.01) | |
| *H04B 1/7156* | (2011.01) | |
| *H04B 1/7143* | (2011.01) | |
| *H03D 7/16* | (2006.01) | |

(52) U.S. Cl.
CPC ......... *H04B 1/7156* (2013.01); *H04B 1/7143* (2013.01); *H03D 7/165* (2013.01); *H04B 2001/71563* (2013.01)

(58) Field of Classification Search
CPC ...... H04B 1/69; H04B 1/6904; H04B 1/6908; H04B 1/713; H04B 1/7143; H04B 1/7156; H04B 1/71563; H04B 1/71566; H04B 2001/71563; H03D 7/165

USPC .......... 375/130, 140, 146, 147, 149
See application file for complete search history.

(56) References Cited

U.S. PATENT DOCUMENTS

| | | | | |
|---|---|---|---|---|
| 6,052,407 A * | 4/2000 | Ciccone | ............... | H03J 1/0091 375/133 |
| 7,248,620 B2 * | 7/2007 | Bott | ..................... | H03M 13/23 375/135 |
| 8,687,670 B2 * | 4/2014 | Ly-Gagnon | ........... | H04W 8/005 375/132 |
| 9,461,701 B1 * | 10/2016 | Mitchener | ............ | H04B 1/7156 |
| 2003/0103589 A1 * | 6/2003 | Nohara | .................. | H04B 1/713 375/350 |
| 2006/0140251 A1 * | 6/2006 | Brown | ................. | H04B 1/7143 375/135 |
| 2009/0232189 A1 * | 9/2009 | Junell | .................... | H04B 1/713 375/137 |
| 2009/0279588 A1 * | 11/2009 | Mochizuki | ............. | H04B 1/713 375/137 |

* cited by examiner

*Primary Examiner* — Siu M Lee
(74) *Attorney, Agent, or Firm* — Ditthavong & Steiner P.C.

(57) ABSTRACT

A measuring device for phase-coherent analysis of frequency-hopping signals is provided. The measuring device comprises a signal acquisition unit and an analyzing unit. Whereas the signal acquisition unit is configured to obtain an In-phase/Quadrature-phase-signal (I/Q-signal) and to provide said I/Q-signal for the analyzing unit, the analyzing unit is configured to detect hop occurrences at nominal hop frequencies based on the provided I/Q-signal. In addition to this, the analyzing unit is further configured to specify at least one common reference frequency with respect to the hop occurrences.

16 Claims, 5 Drawing Sheets

MEASURING DEVICE AND METHOD FOR PHASE-COHERENT ANALYSIS OF FREQUENCY-HOPPING SIGNALS

RELATED APPLICATION

The present application claims priority to U.S. Provisional Application No. 62/565,777, filed on Sep. 29, 2017, which is incorporated herein by reference in its entirety.

TECHNICAL FIELD

The invention relates to a measuring device, especially a spectrum analyzer, and a measuring method for phase-coherent analysis of frequency-hopping signals such as radar signals.

BACKGROUND ART

Generally, in times of an increasing number of applications employing frequency-hopping signals such as radar signals, there is a growing need of a measuring device, especially a spectrum analyzer or oscilloscope or other analyzing equipment, and a measuring method for verifying correct functioning of devices under test generating, transmitting, receiving, or processing such frequency-hopping signals.

U.S. Pat. No. 7,248,620 B2 discloses a frequency-hopping method, in which the data are transmitted in abruptly changing transmission frequency segments (hops), wherein the data in consecutive frequency segments are encoded according to a woven code that comprises the concatenation of an outer and an inner convolutional code. Due to the fact that in accordance with said frequency-hopping method, no common reference frequency is specified. Inaccuracies might occur, which may lead to malfunction.

Accordingly, there is a need to provide a measuring device and measuring method for verifying correct functioning of devices under test employing frequency-hopping signals, whereby inaccuracies are avoided.

SUMMARY OF THE INVENTION

According to a first aspect of the invention, a measuring device for phase-coherent analysis of frequency-hopping signals is provided. The measuring device comprises a signal acquisition unit and an analyzing unit. Whereas the signal acquisition unit is configured to obtain an In-phase/Quadrature-phase-signal (I/Q-signal) and to provide said I/Q-signal for the analyzing unit, the analyzing unit is configured to detect hop occurrences at nominal hop frequencies based on the provided I/Q-signal. In addition to this, the analyzing unit is further configured to specify at least one common reference frequency with respect to the hop occurrences. Advantageously, correct functioning of devices under test employing frequency-hopping signals can be verified, whereby inaccuracies are reduced or completely avoided.

According to a first preferred implementation form of the first aspect, the at least one common reference frequency is based on an user-defined value or on at least one hop occurrence of the hop occurrences. Advantageously, various devices under test can be investigated in a most flexible and efficient manner.

According to a further preferred implementation form of the first aspect, the analyzing unit is further configured to specify at least one common reference phase with respect to the hop occurrences detected by the analyzing unit. Advantageously, correct functioning of devices under test employing frequency-hopping signals can be verified, whereby inaccuracies are further reduced to a minimum or completely avoided.

According to a further preferred implementation form of the first aspect, the at least one common reference phase is based on an at least one hop occurrence of the hop occurrences detected by the analyzing unit. Advantageously, various devices under test can be investigated in a most flexible and efficient manner.

According to a further preferred implementation form of the first aspect, the analyzing unit is further configured to calculate a coherent reference phase trajectory over time based on at least one time stamp of the hop occurrences detected by the analyzing unit, and the at least one common reference frequency specified by the analyzing unit, and the at least one common reference phase. Advantageously, with the aid of the coherent reference phase trajectory, efficiency of phase-coherent analysis can be further increased.

According to a further preferred implementation form of the first aspect, the analyzing unit comprises a phase accumulator, and wherein with the aid of the information provided by the phase accumulator, the analyzing unit extrapolates the coherent reference phase trajectory. Advantageously, the coherent reference phase trajectory can be predicted.

According to a further preferred implementation form of the first aspect, the analyzing unit is further configured to calculate a deviation of the coherent reference phase trajectory to the at least one common reference phase. Advantageously, a benchmark of malfunction can be determined with respect to the device under test.

According to a further preferred implementation form of the first aspect, the measuring device further comprises a display unit, wherein the display unit is configured to display the deviation as at least one measurement result. Advantageously, the benchmark of malfunction with respect to the device under test can be visualized to the user.

According to a further preferred implementation form of the first aspect, the analyzing unit is further configured to apply at least one of the following further processing operations to the deviation: investigating the deviation with respect to its statistical characteristics, conducting trend analysis, fitting the deviation to an arbitrary curve or an user-defined curve. Advantageously, the benchmark of malfunction with respect to the device under test can be further investigated.

According to a second aspect of the invention, a measuring method for phase-coherent analysis of frequency-hopping signals is provided. The measuring method comprises the steps of obtaining an In-phase/Quadrature-phase-signal (I/Q-signal), detecting hop occurrences at nominal hop frequencies based on the I/Q-signal, and specifying at least one common reference frequency with respect to the hop occurrences. Advantageously, correct functioning of devices under test employing frequency-hopping signals can be verified, whereby inaccuracies are reduced or completely avoided.

According to a first preferred implementation form of the second aspect, the at least one common reference frequency is based on an user-defined value or on at least one hop occurrence of the hop occurrences. Advantageously, various devices under test can be investigated in a most flexible and efficient manner.

According to a further preferred implementation form of the second aspect, the method further comprises the step of specifying at least one common reference phase with respect to the detected hop occurrences. Advantageously, correct functioning of devices under test employing frequency-hopping signals can be verified, whereby inaccuracies are further reduced to a minimum or completely avoided.

According to a further preferred implementation form of the second aspect, the at least one common reference phase is based on an at least one hop occurrence of the detected hop occurrences. Advantageously, various devices under test can be investigated in a most flexible and efficient manner.

According to a further preferred implementation form of the second aspect, the method further comprises the step of calculating a coherent reference phase trajectory over time based on at least one time stamp of the detected hop occurrences, and the at least one specified common reference frequency, and the at least one specified common reference phase. Advantageously, with the aid of the coherent reference phase trajectory, efficiency of phase-coherent analysis can be further increased.

According to a further preferred implementation form of the second aspect, the method further comprises the step of using a phase accumulator in order to extrapolate the coherent reference phase trajectory with the aid of the information provided by the phase accumulator. Advantageously, the coherent reference phase trajectory can be predicted.

According to a further preferred implementation form of the second aspect, the method further comprises the step of calculating a deviation of the coherent reference phase trajectory to the at least one common reference phase. Advantageously, a benchmark of malfunction can be determined with respect to the device under test.

According to a further preferred implementation form of the second aspect, the method further comprises the step of displaying the deviation as at least one measurement result. Advantageously, the benchmark of malfunction with respect to the device under test can be visualized to the user.

According to a further preferred implementation form of the second aspect, the method further comprises the step of applying at least one of the following further processing operations to the deviation: investigating the deviation with respect to its statistical characteristics, conducting trend analysis, fitting the deviation to an arbitrary curve or an user-defined curve. Advantageously, the benchmark of malfunction with respect to the device under test can be further investigated.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
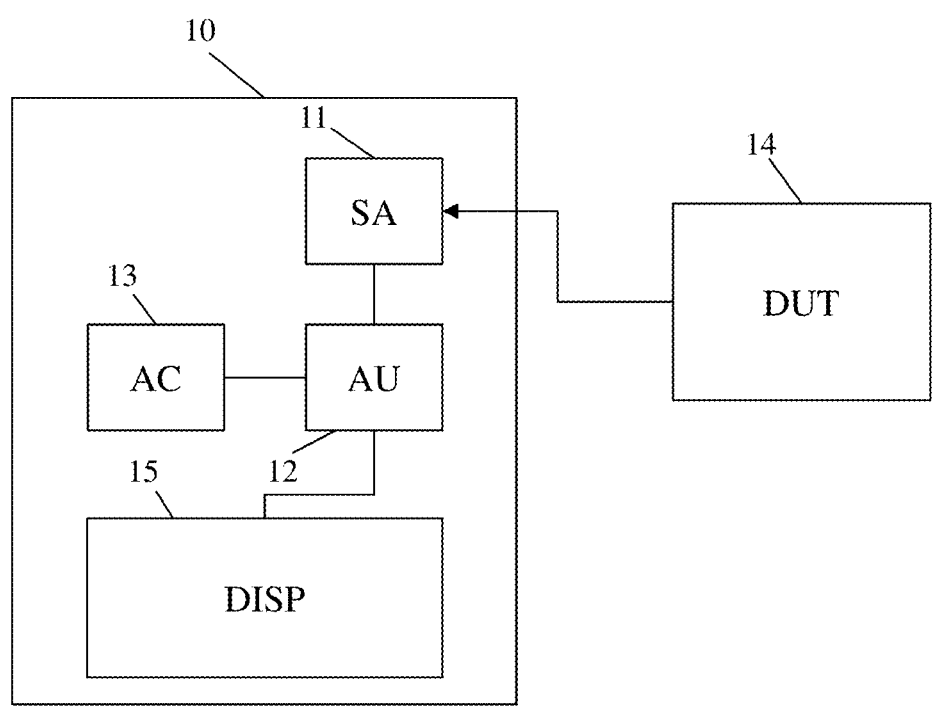
FIG. 1 shows a block diagram of an exemplary embodiment of a measuring device according to the first aspect of the invention.

FIG. 1 shows a block diagram of an exemplary embodiment of a measuring device 10 according to the first aspect of the invention. The measuring device 10 comprises a signal acquisition unit 11, an analyzing unit 12, a phase accumulator 13, and a display unit 15.

The signal acquisition unit 11 is configured to obtain a signal, especially an In-phase/Quadrature-phase-signal (I/Q-signal), from a signal source, exemplarily a device under test 14, and to provide said signal for the analyzing unit 12 which is connected to the signal acquisition unit 11.

Furthermore, on the basis of the signal, especially the I/Q-signal, provided by the signal acquisition unit 11, the analyzing unit 12 is configured to detect hop occurrences at nominal hop frequencies. In addition to this, said analyzing unit 12 is further configured to specify at least one common reference frequency with respect to said hop occurrences. In this context, it is noted that the at least one common reference frequency is preferably based on an user-defined value or on at least one hop occurrence of the hop occurrences.

Moreover, the analyzing unit 12 is further configured to specify at least one common reference phase with respect to the hop occurrences detected by the analyzing unit 12. At this point, it should be mentioned that the at least one common reference phase is preferably based on an at least one hop occurrence of the hop occurrences detected by the analyzing unit 12.

Additionally, the analyzing unit 12 is further configured to calculate a coherent reference phase trajectory over time, preferably at least one coherent reference phase trajectory over time, based on at least one time stamp of the hop occurrences detected by the analyzing unit 12, and the at least one common reference frequency specified by the analyzing unit 12, and the at least one common reference phase also specified by the analyzing unit 12.

As it can be seen from FIG. 1, the analyzing unit 12 is not only connected to the signal acquisition unit 11 but also to the phase accumulator 13. Alternatively, the analyzing unit 12 preferably comprises the phase accumulator 13. In this context, with the aid of the information, especially with the aid of an accumulated phase, provided by the phase accumulator 13, the analyzing unit 12 extrapolates the coherent reference phase trajectory, especially the at least one coherent reference phase trajectory.

Furthermore, the analyzing unit 12 is further configured to calculate a deviation of the coherent reference phase trajectory, preferably a deviation of the at least one coherent reference phase trajectory, to the at least one common reference phase. In this context, the analyzing unit 12 is additionally connected to the display unit 15 which is configured to display said deviation as at least one measurement result.

With respect to said deviation, it is in particular advantageous if the analyzing unit 12 is further configured to apply at least one of the following further processing operations to the deviation: investigating the deviation with respect to its statistical characteristics, conducting trend analysis, fitting the deviation to an arbitrary curve or an user-defined curve.

Figure 2:
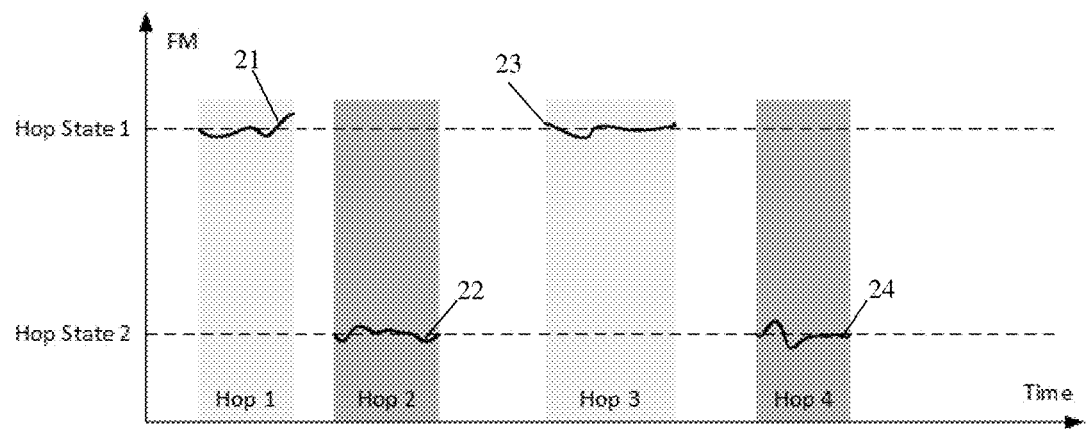
FIG. 2 shows an exemplary frequency diagram, wherein hop occurrences at two nominal hop frequencies have been detected.

Now, with respect to FIG. 2, an exemplary frequency diagram is shown. In this exemplary case, as it can be seen that there are two different hop states (Hop State 1, Hop State 2), in other words, two different nominal hop frequencies. Furthermore, in this exemplary case, four hops (Hop 1, Hop 2, Hop 3, Hop 4), in other words, four hop occurrences, have been detected at said two exemplary nominal hop frequencies with the aid of the analyzing unit 12 of the measuring device 10 according to FIG. 1. In addition to this, FIG. 2 also shows the respective course of frequency 21, 22, 23, 24 within the corresponding hop occurrence.

Figure 3:
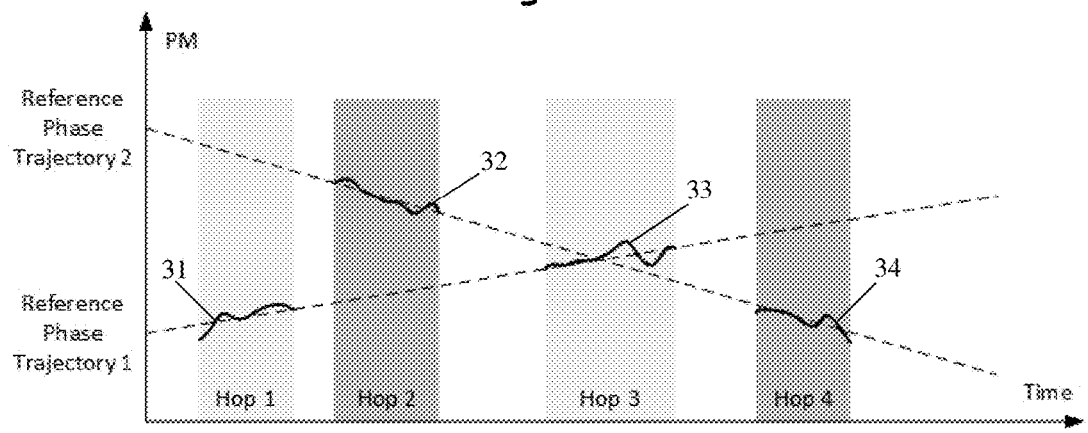
FIG. 3 shows an exemplary phase diagram, wherein two coherent reference phase trajectories are marked, which have been calculated with the aid of the invention.

Furthermore, FIG. 3 illustrates an exemplary phase diagram with respect to the four hop occurrences detected at the two nominal hop frequencies according to FIG. 2. As it can be seen from FIG. 3, two exemplarily reference phase trajectories (Reference Phase Trajectory 1, Reference Phase Trajectory 2) have been marked on the phase diagram. These reference phase trajectories have especially been calculated with the aid of the analyzing unit 12 of the measuring device 10 according to FIG. 1. In this context, it is noted that it is particularly advantageous if the number of reference phase trajectories, preferably of coherent reference phase trajectories, is equal to the number of nominal hop frequencies. Alternatively, the number of reference phase trajectories, preferably of coherent reference phase trajectories, may be lower or equal to the number of nominal hop frequencies.

In addition to this, FIG. 3 also shows the respective course of phase 31, 32, 33, 34 within the corresponding hop occurrence. Further advantageously, for each nominal hop frequency, a phase accumulator is provided. Therefore, in this exemplary case, it was particularly advantageous if two of the phase accumulator 13 of the measuring device 10 are used due to the two nominal hop frequencies.

Figure 4:
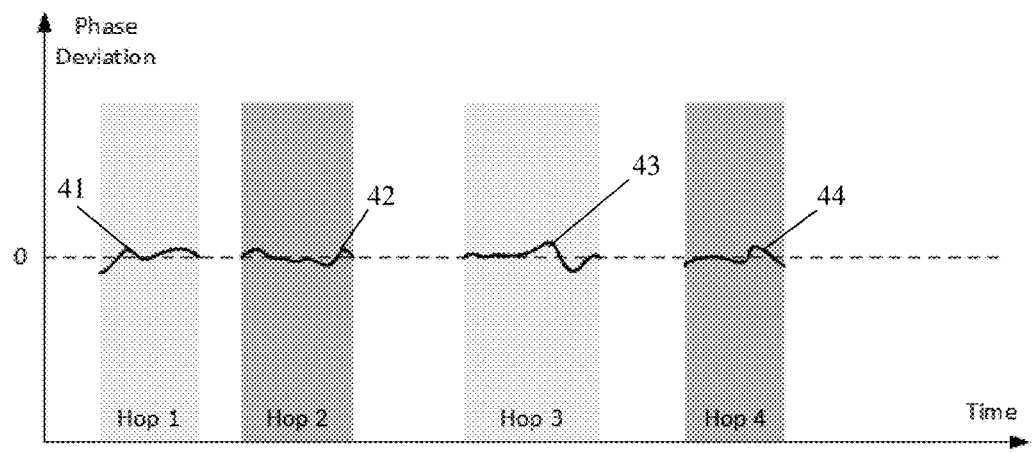
FIG. 4 shows an exemplary diagram of a phase deviation which has been calculated with the aid of the invention.

Moreover, the respective courses of phase deviation 41, 42, 43, 44 with respect to the courses of phase 31, 32, 33, 34 to the corresponding reference phase trajectory are illustrated with the aid of the exemplary phase deviation diagram according to FIG. 4. Said phase deviation has especially been calculated with the aid of the analyzing unit 12 of the measuring device 10 according to FIG. 1 and can be displayed on the display unit 15 of the measuring device 10 as at least one measurement result.

Figure 5:
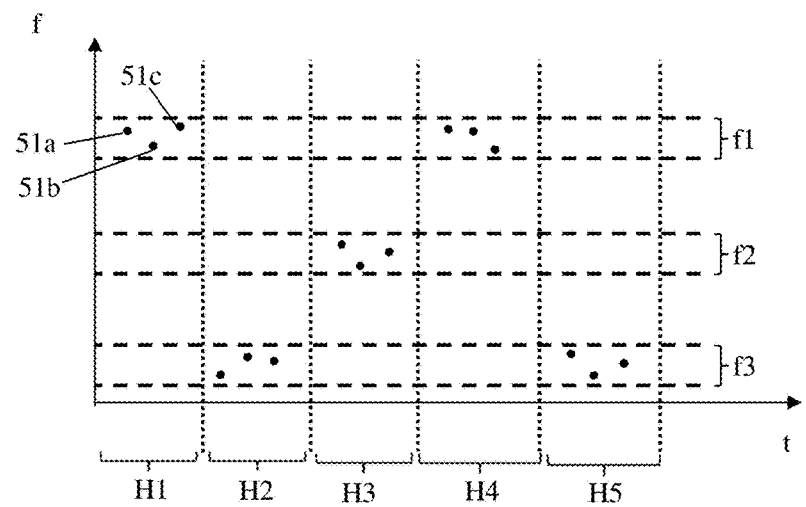
FIG. 5 shows a further exemplary frequency diagram, wherein hop occurrences at three nominal hop frequencies have been detected.

In addition to FIG. 2, FIG. 5 shows a further exemplary frequency diagram. In this exemplary case, a frequency-hopping signal, especially a broadband frequency-hopping signal, has been recorded over time. Then, as it can be seen, frequency points within a certain frequency range are allocated to the corresponding nominal hop frequency. Exemplarily, frequency points 51a, 51b, and 51c are within the frequency range of nominal hop frequency f1, which leads to an allocation of these frequency points to the nominal hop frequency f1. In other words, the frequency of a frequency point allocated to a certain nominal hop frequency is higher than a lower limit and lower than an upper limit with respect to the certain nominal hop frequency.

In addition to this, said frequency points 51a, 51b, 51 have not only been detected at the nominal hop frequency f1 but also as a first hop occurrence H1. In an analogous manner, the remaining frequency points which are not separately provided with reference signs and shown in the diagram illustrating an exemplary detection of five hop occurrences (H1, H2, H3, H4, H5) at three nominal hop frequencies (f1, f2, f3) are also allocated to the respective hop occurrence at the corresponding nominal hop frequency.

Figure 6:
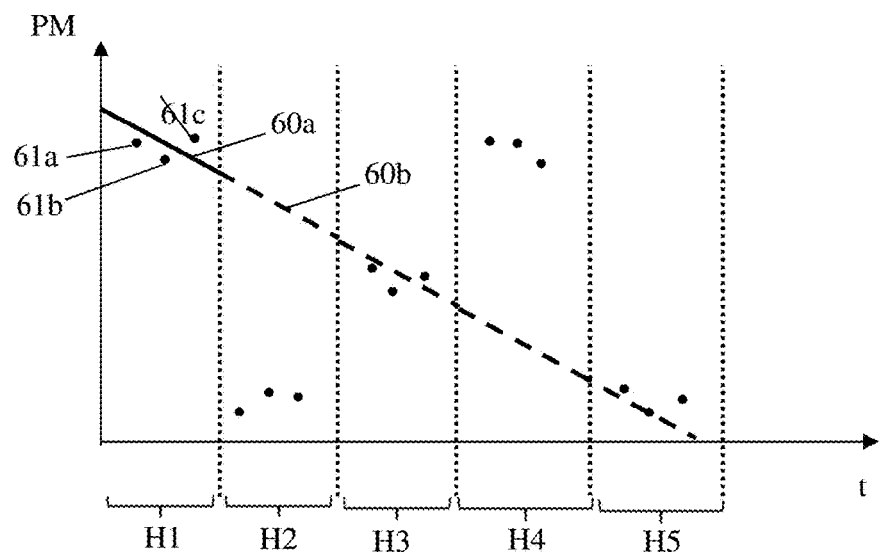
FIG. 6 shows a further exemplary phase diagram, wherein one coherent reference phase trajectory is marked, which has been calculated and interpolated on the basis of a single hop.

Moreover, in addition to FIG. 3, FIG. 6 shows a further exemplary phase diagram. In this case, one coherent reference phase trajectory comprising line 60a and dashed line 60b is marked. Said coherent reference phase trajectory has been calculated and interpolated on the basis of a single hop, namely hop H1, which is expressed by the line 60a being not dashed within H1. Additionally, on the basis of the coherent reference phase trajectory 60a within the first hop H1, the coherent reference phase trajectory 60b can be interpolated with respect to future hops such as hops H2, H3, H4, and H5.

Generally, in other words, with the aid of a coherent reference phase trajectory calculated on the basis of a single hop, which is especially used as a kind of master hop, a coherent reference phase trajectory can be calculated with respect to at least one future hop, especially at least one respective future hop. Advantageously, with the aid of this measure, a measurement result can be achieved very quickly.

Figure 7:
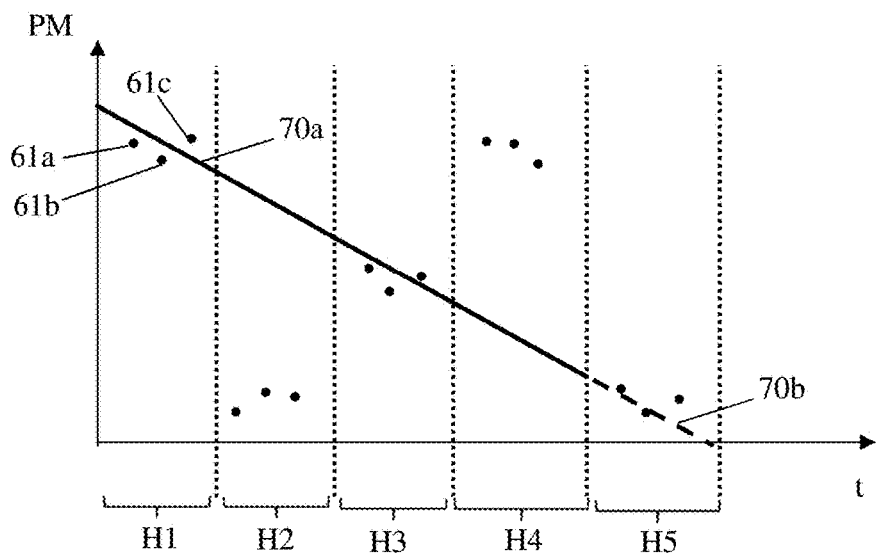
FIG. 7 shows a further exemplary phase diagram, wherein one coherent reference phase trajectory is marked, which has been calculated and interpolated on the basis of a plurality of hops.

Furthermore, in addition to FIG. 3 and FIG. 6, FIG. 7 shows a further exemplary phase diagram. In this exemplary case, one coherent reference phase trajectory comprising line 70a and dashed line 70b is marked. Said coherent reference phase trajectory has been calculated and interpolated on the basis of a plurality of hops, namely hops H1 to H4, which is expressed by the line 70a being not dashed within said hops H1 to H4. Additionally, on the basis of coherent reference phase trajectory 60a within the hops H1 to H4, the coherent reference phase trajectory 60b can be interpolated with respect to a future hop such as hop H5.

Generally, in other words, a coherent reference phase trajectory of a n-th hop, wherein n is an integer number, can be determined with the aid of an interpolation over the respective n−1 preceding hops. Advantageously, with the aid of this measure, a measurement result can be achieved very quickly and accurately.

In addition to all the examples given above, some further aspects within the scope of the present invention should be discussed in the following.

As already mentioned above, the analyzing unit 12 of the measuring device 10 according to FIG. 1 may advantageously extrapolate the coherent reference phase trajectory. As an alternative to this measure, the at least one coherent reference phase trajectory may be interpolated over a plurality of preceding hops or over all preceding hops.

Alternatively, a frequency demodulation may be conducted exemplarily by the analyzing unit 12 of the measuring device 10 in order to investigate the signal to be analyzed with respect to phase-coherence.

As a further alternative, after solely the signal power has been measured exemplarily with the aid of the analyzing unit 12 of the measuring device 10, the analyzing unit 12 determines trajectories only for these points where power has been found, in other word, where pulses of the respective signal occur.

Further alternatively, the at least one coherent reference phase trajectory may be determined on the basis of a maximum likelihood estimation.

In addition to the foregoing alternatives, it should be mentioned that for phase-coherent analysis of frequency-hopping signals, the signal, especially the I/Q-signal, may firstly be sampled at a plurality or each of the nominal hop frequencies. Then, on the basis of these samples, it may be determined if the respective phases are coherent.

Figure 8:
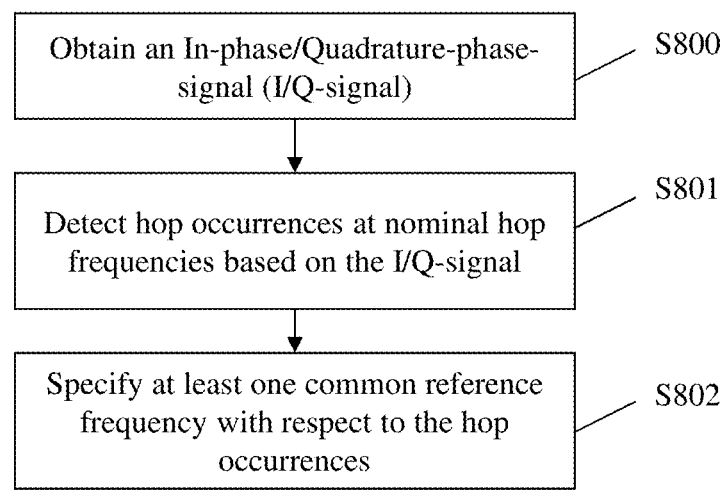
FIG. 8 shows a flow chart of an exemplary embodiment of the second aspect of the invention.

Finally, FIG. 8 shows a flow chart of the inventive method. In a first step S800, an In-phase/Quadrature-phasesignal (I/Q-signal) is obtained. Then, in a second step S801, hop occurrences at nominal hop frequencies are detected based on the I/Q-signal. Finally, in a third step S802, at least one common reference frequency is specified with respect to the hop occurrences.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measuring device for phase-coherent analysis of frequency-hopping signals, the measuring device comprising:
    a signal acquirer obtaining an In-phase/Quadrature-phase-signal (I/Q-signal), and
    an analyzer receiving the I/Q-signal from the signal acquirer, detecting hop occurrences at nominal hop frequencies based on the provided I/Q-signal, specifying at least one common reference frequency with respect to the hop occurrences, and specifying at least one common reference phase with respect to the hop occurrences detected by the analyzer.

2. The measuring device according to claim 1,
    wherein the at least one common reference frequency is based on an user-defined value or on at least one hop occurrence of the hop occurrences.

3. The measuring device according to claim 1,
    wherein the at least one common reference phase is based on an at least one hop occurrence of the hop occurrences detected by the analyzer.

4. The measuring device according to claim 1,
    wherein the analyzer is further configured to calculate a coherent reference phase trajectory over time based on at least one time stamp of the hop occurrences detected by the analyzer, and the at least one common reference frequency specified by the analyzer, and the at least one common reference phase.

5. The measuring device according to claim 4,
    wherein the analyzer comprises a phase accumulator, and wherein with the aid of the information provided by the phase accumulator, the analyzer extrapolates the coherent reference phase trajectory.

6. The measuring device according to claim 4,
    wherein the analyzer is further configured to calculate a deviation of the coherent reference phase trajectory to the at least one common reference phase.

7. The measuring device according to claim 6,
    wherein the measuring device further comprises a display, wherein the display is configured to display the deviation as at least one measurement result.

8. The measuring device according to claim 6,
    wherein the analyzer is further configured to apply at least one of the following further processing operations to the deviation: investigating the deviation with respect to its statistical characteristics, conducting trend analysis, fitting the deviation to an arbitrary curve or an user-defined curve.

9. A measuring method for phase-coherent analysis of frequency-hopping signals, the measuring method comprises the steps of:
    obtaining an In-phase/Quadrature-phase-signal (I/Q-signal),
    detecting hop occurrences at nominal hop frequencies based on the I/Q-signal,
    specifying at least one common reference frequency with respect to the hop occurrences, and
    specifying at least one common reference phase with respect to the detected hop occurrences.

10. The measuring method according to claim 9,
    wherein the at least one common reference frequency is based on an user-defined value or on at least one hop occurrence of the hop occurrences.

11. The measuring method according to claim 9,
    wherein the at least one common reference phase is based on an at least one hop occurrence of the detected hop occurrences.

12. The measuring method according to claim 9,
    wherein the method further comprises the step of calculating a coherent reference phase trajectory over time based on at least one time stamp of the detected hop occurrences, and the at least one specified common reference frequency, and the at least one specified common reference phase.

13. The measuring method according to claim 12,
    wherein the method further comprises the step of using a phase accumulator in order to extrapolate the coherent reference phase trajectory with the aid of the information provided by the phase accumulator.

14. The measuring method according to claim 12,
    wherein the method further comprises the step of calculating a deviation of the coherent reference phase trajectory to the at least one common reference phase.

15. The measuring method according to claim 14,
    wherein the method further comprises the step of displaying the deviation as at least one measurement result.

16. The measuring method according to claim 14,
    wherein the method further comprises the step of applying at least one of the following further processing operations to the deviation: investigating the deviation with respect to its statistical characteristics, conducting trend analysis, fitting the deviation to an arbitrary curve or an user-defined curve.

* * * * *